US006794117B2

(12) United States Patent
Andrews

(10) Patent No.: US 6,794,117 B2
(45) Date of Patent: Sep. 21, 2004

(54) PROCESS TO PRODUCE A CUSTOM-COLOR OVERLAY

(75) Inventor: Ann E. Andrews, West St. Paul, MN (US)

(73) Assignee: Kodak Polychrome Graphics, Norwalk, CT (US)

( * ) Notice: Subject to any disclaimer, the term of this patent is extended or adjusted under 35 U.S.C. 154(b) by 0 days.

(21) Appl. No.: 10/281,798

(22) Filed: Oct. 28, 2002

(65) Prior Publication Data

US 2004/0081915 A1 Apr. 29, 2004

(51) Int. Cl.$^7$ .................................................. G03F 9/00
(52) U.S. Cl. ....................................................... 430/293
(58) Field of Search ................................ 430/292, 239, 430/293

(56) References Cited

U.S. PATENT DOCUMENTS

| | | | |
|---|---|---|---|
| 3,136,637 A | * | 6/1964 | Larson ........................ 430/162 |
| 4,282,308 A | | 8/1981 | Cohen et al. |
| 4,489,153 A | | 12/1984 | Ashcraft et al. |
| 4,489,154 A | | 12/1984 | Taylor, Jr. |
| 4,596,757 A | | 6/1986 | Barton et al. |
| 5,001,037 A | | 3/1991 | Matthews et al. |
| 5,122,437 A | | 6/1992 | Matthews et al. |
| 5,232,814 A | | 8/1993 | Graves et al. |
| 5,484,919 A | | 1/1996 | Bonham |
| 6,010,821 A | | 1/2000 | Smith et al. |
| 6,087,060 A | | 7/2000 | Chase et al. |
| 6,194,123 B1 | | 2/2001 | Smith et al. |
| 6,303,271 B1 | | 10/2001 | Bennett et al. |
| 2001/0003638 A1 | | 6/2001 | Warner et al. |

FOREIGN PATENT DOCUMENTS

EP  0 385 466 A2  9/1990

OTHER PUBLICATIONS

"Principles of Color Proofing," by Michael H. Bruno, GAMA Communications (Salem, New Hampshire 1986); Chapter V: "Off–Press Color Proofing System—Overlay" (pp 133–146).
Kodak Polychrome Graphics brochure entitled: "Color with Confidence—Matchprint Color Proofing System", 2002, 12 pages.
Imation and Kodak Polychrome Graphics User's Guide entitled: "Matchprint Plus System for Accurate Custom Color Proofs", 2001, 48 pages.

* cited by examiner

Primary Examiner—John A. McPherson
(74) Attorney, Agent, or Firm—Faegre & Benson LLP

(57) ABSTRACT

Methods for making an imaged custom-color overlay. The method includes a) providing a photosensitive ink of a selected color; b) providing a carrier sheet comprising a transparent support sheet and an ink-receiving layer; c) custom-coating the ink-receiving layer with a layer of the ink; d) drying the ink; e) imagewise exposing; and f) developing. The invention permits an end user of a proofing system to make an imaged overlay in a multitude of custom colors on an as-needed basis, without being limited to those colors that are provided by a manufacturer. The methods are suitable to make custom-color overlays using both analog and digital processes. The photosensitive ink may be water-based. Methods for making an overlay proof including an imaged custom-color overlay are also disclosed. The end user of a proofing system may therefore make highly accurate overlay proofs suitable as contract proofs.

19 Claims, No Drawings

PROCESS TO PRODUCE A CUSTOM-COLOR OVERLAY

TECHNICAL FIELD

The present invention relates to methods for making a custom-color overlay for use in an overlay proof, and methods for making an overlay proof including a custom-color overlay.

BACKGROUND

Pre-press or off-press color proofing is used by printers to simulate the images that will be produced by a printing process. Pre-press color proofing systems include overlay proofing systems and surprint, or single sheet, systems. Both overlay proofs and surprint proofs are commonly used as "contract proofs." A contract proof serves as a promise by the printer to a customer that a proofed image will be duplicated by the printing process when the press prints are made. Therefore, the printer desires to have proofs that can most accurately predict the image that will be reproduced by the press prints. The need for accurate proofs is especially critical where custom colors are employed in the printing process.

In an overlay proof, each printing color is generally segregated onto a separate transparent sheet or film, known as an overlay. The number of overlays in an overlay proof will usually equal the number of inks that will be used in the printing process. The individual overlays are assembled in registration to make the overlay proof, which is viewed as a composite against an appropriate background (e.g., an opaque reflective white sheet), to predict the appearance of a printed image. In an overlay proof the individual overlays remain separable and can be viewed separately or superimposed. A number of commercial overlay proofing systems are described in detail in "Principles of Color Proofing," by Michael H. Bruno, GAMA Communications (Salem, N.H. 1986); see especially Chapter V: "Off-Press Color Proofing System-Overlay" (pp 133–146).

Each overlay is made from an overlay proofing film. A typical overlay proofing film construction includes a substrate and a colored photosensitive layer. Photosensitive proofing films which can be used in image-reproduction processes are well-known in the graphics arts industry. Proofing films are usually exposed to radiation through an image-bearing transparency, such as a color-separation transparency, to reproduce the image onto the proofing film. After imagewise exposure, the photosensitive layer may be developed to produce an imaged overlay. Developing is generally done by washout of soluble image areas, by peeling apart, by toning with a colorant, or combinations of these techniques.

Conventional overlay proofing films are made in large volume and are precolored at a factory. Thus, in the production of an overlay proof, the end user is generally limited to those stock colors that are available from the manufacturer. Because of the cost of manufacturing, storing, and distributing overlay proofing film materials, necessarily only a limited range of colors will be available from a manufacturer. The limited range of colors provided by the manufacturer is adequate for many purposes, but does not enable an end user to accurately mimic difficult-to-match colors. For example, many fluorescent or metallic colors are virtually impossible to mimic using the standard process colors cyan, magenta, yellow and black.

Methods for making overlay proofs including a custom color are known. U.S. Pat. Nos. 5,001,037 and 5,122,437 to Matthews, et al report a process for preparing a multi-layered, multi-colored overlay proof comprising at least one precolored overlay image and at least one toned image. The process includes the steps of exposing a non-colored tonable photosensitive overlay element, developing the exposed overlay element, and toning the developed photosensitive element using a toner. U.S. Pat. No. 5,232,814 to Graves, et al reports color proofing elements for producing images in non-standard colors, and in particular metallic-appearing images. The proofing elements include a support layer and require two layers of pigment.

SUMMARY OF THE INVENTION

In one embodiment, the present invention provides a method for making an imaged custom-color overlay. The method includes the steps of a) providing a photosensitive water-soluble ink of a selected custom color; b) providing a carrier sheet comprising a transparent support sheet and an ink-receiving layer; c) custom-coating the ink-receiving layer with a substantially uniform layer of the ink; d) drying the ink to produce a custom-coated ink-receiving layer; e) imagewise exposing the custom-coated ink-receiving layer, to produce an exposed custom-coated layer; and f) developing the exposed custom-coated layer, to provide the imaged custom-color overlay.

The steps of custom-coating and drying are carried out by an end user rather than by a manufacturer. The end user is therefore able to conveniently prepare a custom-coated ink-receiving layer in any color that is desired, and is not limited to those colors that are provided by a manufacturer.

In another embodiment, the invention provides a method for making an overlay proof including an imaged custom-color overlay. The method includes the steps of making an imaged custom-color overlay according to a method described herein, and assembling in registration the imaged custom-color overlay with at least one other proof component to produce the overlay proof.

The present invention further provides a custom-color overlay made by the methods described herein, and an overlay proof including a custom-color overlay made by the methods described herein.

Practice of the present invention permits an end user of a proofing system to make a custom-color overlay in a multitude of custom colors on an as-needed basis. The end user is no longer limited to overlays of only the stock colors available as precolored overlay proofing films. For example, there are presently fewer than twenty-five stock colors available in precolored proofing films for negative COLOR KEY applications. The present invention, in contrast, allows an end user to mix a photosensitive ink in any of hundreds of custom colors according to known or custom ink formulations, or to make a specially targeted color, and to prepare an imaged custom-color overlay in that color. The invention thus eliminates the need for an end user to special-order large quantities of a factory-precolored overlay film in the selected custom color.

The present invention enables an end user to produce an overlay proof of high accuracy. The end user may make an imaged custom-color overlay in any of hundreds of custom colors, and may thereby accurately simulate images that will be produced by a printing process. Overlay proofs of high accuracy for use as contract proofs may therefore be made according to the methods of the invention.

Another advantage is that the invention enables an end user to prepare custom-color overlays in multiple custom colors, and to test the suitability of each color by interchanging overlays in an overlay proof. For example, an end user desiring to make a specific color of red could make custom-color overlays in two or more shades of red, and could interchange the colors to aid in choosing the most suitable color.

In an embodiment of the invention, the photosensitive ink is water-based. This feature makes the invention easy to implement by an end user without special precautions or equipment that would be required for solvent-based inks.

All consumable materials that are necessary for the practice of the present invention are commercially available at the present time. Therefore, the invention may be readily practiced by any end user that has access to the necessary equipment. Furthermore, the imaged custom-color overlay can be made with equipment and materials that are ordinarily used for making surprint proofs. An advantage of the methods of the invention, therefore, is that an end user is provided the flexibility of making either surprint proofs or overlay proofs with the same equipment and the same set of consumable materials.

DETAILED DESCRIPTION OF THE INVENTION

Imaged Overlay

In one embodiment, the present invention provides a method for making an imaged custom-color overlay. The method includes the steps of a) providing a photosensitive water-soluble ink of a selected custom color; b) providing a carrier sheet comprising a transparent support sheet and an ink-receiving layer; c) custom-coating the ink-receiving layer with a substantially uniform layer of the ink; d) drying the ink to produce a custom-coated ink-receiving layer; e) imagewise exposing the custom-coated ink-receiving layer, to produce an exposed custom-coated layer; and f) developing the exposed custom-coated layer, to provide the imaged custom-color overlay.

In another embodiment, the invention provides a method for producing an imaged overlay. The method is as described in the preceding paragraph, except that the ink need not be water-soluble, and ink of any selected color may be used.

Photosensitive Ink

In one step of the method, a photosensitive ink of a selected color is provided. In some embodiments, the selected color is a custom color.

As used herein, the term "ink" and the phrase "ink formulation" are used interchangeably to refer to any pigment-carrying or color-providing composition that may be coated onto an ink-receiving layer. As used herein, the term "photosensitive" when used to describe an ink formulation means that the ink formulation is photopolymerizable, photocrosslinkable, photodimerizable, photocurable, or photohardenable; furthermore, the term "photosensitive" can include ink formulations that are photodegradable, photoablatable, photobleachable, or photosolubilizable.

In one embodiment of the present invention, the photosensitive ink comprises a photopolymerizable component. Typically, a photopolymerizable ink formulation includes one or more pigments dispersed in a photocurable medium comprising at least a suitable polymerizable monomer, a photoinitiator, and a binder. Photopolymerizable ink formulations are conventional in the art. A photosensitive ink formulation may also include a surfactant. Fluorinated surfactants, for example, are used as a coating aid to promote even wetting, to enhance coating uniformity, and to prevent striations in the coating.

In an embodiment of the present invention, the photosensitive ink is water-soluble or water-based. The use of water-soluble or water-based inks is desirable, since inks that include an organic solvent are accompanied by health and safety concerns and are typically more expensive and more difficult to work with. However, the methods of the invention are not limited to water-based inks, but may be practiced using any suitable photosensitive ink.

By way of example, one suitable water-based and water-soluble photosensitive ink is available from Kodak Polychrome Graphics under the brand MATCHPRINT PLUS INKS. Any of the MATCHPRINT PLUS INKS is suitable in the practice of the present invention.

Some embodiments of the present invention require that the photosensitive ink represent a selected custom color (a "custom-color ink"). As used herein, the phrase "custom color" means any color that is not a stock color, and that may be provided by a photosensitive ink. A "stock color" is a color for which precolored overlay films are manufactured and available on demand (i.e., does not have to be special-ordered or specially manufactured). Process colors cyan, magenta, yellow, and black, for example, are stock colors for which precolored overlay films are available.

In one embodiment, the custom-color ink is blended from at least two stock inks. A "stock ink" is a photosensitive ink that is commercially available to the end user in a ready-to-use form. Stock inks are available, for example, from Kodak Polychrome Graphics under the brand MATCHPRINT PLUS INKS. Presently, stock inks are available in approximately twenty-three colors in the MATCHPRINT PLUS INKS line. The process of blending inks according to formulations may be done by conventional methods.

By way of example, a custom-color ink may be blended from at least two stock inks according to a published formulation to provide the photosensitive ink of the selected custom color. Formulations are published in color-mixing guides by, for example, Kodak Polychrome Graphics (Norwalk, Conn.) under the title "MATCHPRINT PLUS Mixing Guide For PANTONE Colors," and by Pantone Inc. (Carlstadt, N.J.) under the title "PANTONE Formula Guide." A custom-color ink prepared according to a published formulation is especially useful for proofing jobs where an ink of the same color is to be used in the printing process. The present invention therefore allows an end user to accurately simulate printing colors that are selected by reference to a color-mixing guide.

A custom-color ink may also be blended from stock inks without reference to a published formulation, such as when the end user wishes to blend a color that is not accurately captured by a published formulation. In an alternative embodiment, a custom-color ink comprises only one stock ink, such as where the stock ink is one for which a precolored overlay film is not available.

In another embodiment, the selected custom color is matched to a predetermined color. A "predetermined color" is one that the end user desires to match for the purposes of making an accurate overlay proof. In order to match a predetermined color, it may be necessary for the end user to blend and correct an ink formulation, or to customize an ink formulation. Those steps are well within the skill of one in the art.

For instance, the end user may wish to match a predetermined color such as a selected PANTONE color. Alternatively, the end user may wish to provide a predetermined color that is difficult or impossible to reproduce using only standard process-color overlays. By way of example, the methods of the present invention may be used to produce a custom color overlay including a metallic or fluorescent specialty color.

In one application, the present invention enables the end user to accurately match the selected custom color to a specific predetermined color in a corporate indicia such as a corporate logo or trademark, especially one that is not accurately matched to a stock color. Furthermore, the invention enables the end user to match a selected custom color that is not accurately matched to a PANTONE color or other reference color. This feature of the invention permits the end user to make the most accurate overlay proofs, which is especially useful for purposes of contract proofing.

In another embodiment of the invention, there is no requirement that the photosensitive ink is a custom-color ink. The methods of the present invention may be employed by an end user to make an imaged overlay in a stock color.

Carrier Sheet

In another step of the method, a carrier sheet is provided, the carrier sheet comprising a transparent support sheet and an ink-receiving layer. Generally, the carrier sheet is non-colored and transparent.

The carrier sheet comprises a transparent support sheet. The support sheet is transparent so that an image underlying the resulting custom-color overlay will be visible through the support sheet. A non-colored transparent support sheet is suitable for most applications.

The carrier sheet further comprises an ink-receiving layer. The ink-receiving layer provides a surface to which the photosensitive ink may be applied. For example, when the ink is a fluid, the ink-receptive layer should be wettable by the ink. The ink-receiving layer may include a coating that is applied to the transparent support sheet, or a surface of the transparent support sheet may be treated or otherwise prepared to yield an ink-receiving layer. The transparent support sheet may serve as a protective cover for the ink-receiving layer.

One suitable carrier sheet for the practice of the invention includes a laminated transparent support sheet and an ink-receiving emulsion layer. The laminated transparent support sheet includes two layers of biaxially-oriented polypropylene (BOPP) sandwiching a layer of polyester film. One such laminated transparent support sheet includes 200-gauge polyester film having a sheet of 90-gauge BOPP laminated to each side. The carrier sheet of this embodiment further includes a coating that is applied to the laminated transparent support sheet from a water-based emulsion of 10.5-micron polymethylmethacrylate (PMMA) beads, polyvinylpyrrolidone, isopropanol, and fluorinated surfactants FC-430 and FC-171. The emulsion is coated onto the laminated transparent support sheet and dried to yield an ink-receiving emulsion layer at a coating weight of about 650 mg/ft$^2$.

In general, an end user will choose to purchase commercially available carrier sheets that are suitable for use in the methods of the present invention. A suitable transparent, non-colored carrier sheet is commercially available from Kodak Polychrome Graphics under the trade name MATCHPRINT PLUS RECEIVER SHEET. Other commercially available carrier sheets comprising a transparent support sheet and an ink-receiving layer are suitable for the practice of the present invention.

The commercially available MATCHPRINT PLUS RECEIVER SHEET is manufactured and marketed especially for methods of making laminated surprints. In a method for making a laminated surprint, a protective slip sheet is removed from a MATCHPRINT PLUS RECEIVER SHEET. The MATCHPRINT PLUS RECEIVER SHEET is then laminated to a surprint base such as MATCHPRINT COMMERCIAL BASE by the application of heat, with an ink-receiving emulsion layer of the MATCHPRINT PLUS RECEIVER SHEET facing the surprint base. Then the transparent support sheet is peeled away, leaving the ink-receiving emulsion layer on the surprint base. The ink-receiving emulsion layer on the surprint base can then be coated with a photosensitive ink.

However, by the methods of the present invention, the MATCHPRINT PLUS RECEIVER SHEET is no longer limited to use in surprint proofs, but now may be used to make overlay proofs. An overlay for an overlay proof may be made using a MATCHPRINT PLUS RECEIVER SHEET without a lamination step, and without the application of heat, as would be required when making a laminated surprint proof. Thus, an end user is provided the flexibility of making either surprint proofs or overlay proofs with the same equipment and the same set of consumable materials. Furthermore, an overlay proof may be made with fewer steps than is required for a laminated surprint proof.

Custom-Coating of the Carrier Sheet with the Photosensitive Ink

Another step of the method includes custom-coating a substantially uniform layer of the photosensitive ink onto the ink-receiving layer of the carrier sheet. As used herein, the phrase "custom-coating" means a coating process by which the ink-receiving layer is coated with the photosensitive ink by an end user, rather than by a manufacturer. The step of custom-coating is generally carried out on-site, and can be conveniently done on-demand, i.e., at the time that an imaged overlay is required.

The end user is therefore able to efficiently prepare imaged overlays in any desired color on an as-needed basis, and is not limited to those colors that are provided by a manufacturer. Furthermore, where the selected color is a custom color, the end user no longer needs to special-order large quantities of a factory-precolored overlay film in the selected custom color. The invention thus provides the end user with a cost-efficient and materials-efficient method for making overlay proofs including an imaged custom-color overlay.

The custom-coating step may be performed, by many coating processes. For example, one suitable coating process employs a Meyer bar or other wire-wound metering rod. The custom-coating step may also be performed using any conventional coating process, such as air doctor coating, blade coating, air knife coating, squeeze coating, reverse roll coating, transfer roll coating, gravure coating, kiss coating, cast coating, spray coating, dip coating, bar coating, extrusion coating, or die coating, for example.

By "substantially uniform," it is meant that the layer of photosensitive ink should be coated with relatively even thickness and sufficiently free from defects (such as pinholes or voids) in the area to be coated so that the quality of an image will not be compromised. The substantially uniform layer does not have to cover the entire carrier sheet. As determined by the end user, it may be desirable to coat the photosensitive ink only in the area of the carrier sheet onto which an image will be reproduced. This practice may enable the end user to conserve materials such as photosensitive ink or developing solution.

The end user may desire to use an automated coating apparatus for the custom-coating step. By way of example, one suitable apparatus is the MODEL 3040 MATCHPRINT PLUS COATER from Kodak Polychrome Graphics, fitted with a #11 Meyer bar. A #11 Meyer bar will produce a wet coating thickness of about 23.8 micrometers.

A wide range of coating thicknesses or coating weights will be suitable. The end user may desire a coating thickness greater than or less than 23.8 micrometers, depending on the application. A thicker coating may be used to produce a denser image, and a thinner coating may be used to produce a less dense image. When the end user is using a custom-color ink prepared in accordance with a formulation found in the "MATCHPRINT PLUS Mixing Guide For PANTONE Colors," a #11 Meyer bar should be employed to ensure accurate color reproduction.

Drying the Ink

After custom-coating the ink-receiving layer with the photosensitive ink, the ink is dried or otherwise made fast to the ink-receiving layer to produce a custom-coated ink-receiving layer. For the purposes of this specification, drying or other methods of making fast the ink should be considered as equivalent.

For an aqueous-based ink, the ink may be dried by evaporating or otherwise removing excess water, such as by application of heat or by fan-drying or both. By way of example, heating to 100° C. for thirty seconds or more may be sufficient to remove excess water from the ink. When heat is used to dry the ink, care must be exercised so that neither the ink nor the carrier sheet is functionally destroyed or damaged.

If a solvent-based ink is used, the ink may be dried by evaporating or otherwise removing solvent, while taking precautions to avoid igniting the solvent or producing unacceptable contamination of air, water, or workplace environment.

An advantage of using an automated coating apparatus such as the MODEL 3040 MATCHPRINT PLUS COATER is that the drying step may also be performed in an automated fashion. The MODEL 3040 MATCHPRINT PLUS COATER uses blown warm air to dry the ink.

Imagewise Exposure

After the ink is dried to produce a custom-coated ink-receiving layer, the custom-coated ink-receiving layer is imagewise exposed. Imagewise exposure induces or initiates a change in the photosensitive ink in the exposed areas.

Generally imagewise exposure includes exposing the custom-coated ink-receiving layer to a source of radiation. Any convenient source may be used, so long as the source provides radiation to which the ink is photosensitive. For example, suitable sources of radiation include ultraviolet light sources, laser sources, fluorescent lamps, arc lamps, infrared sources, etc. Both analog and digital processes may be used for imagewise exposure of the custom-coated ink-receiving layer.

Imagewise exposure in analog processes is generally performed using an image-bearing transparency. The carrier sheet may be held in position using a vacuum frame or other means. The image-bearing transparency is positioned between the source of radiation and the custom-coated ink-receiving layer. Often, the image-bearing transparency will be a color-separation transparency corresponding to the color of the custom-coated ink-receiving layer.

As will be familiar to those skilled in the art, an image-bearing transparency is usually of either the positive-type or negative-type. In the practice of the present invention, the appropriate type of image-bearing transparency is determined by the nature of the photosensitive ink and the type of image desired. A negative-working photosensitive ink remains in exposed areas after developing, and is removed from unexposed areas. A positive-working photosensitive ink remains in unexposed areas and is removed from exposed areas.

By way of example, if a positive image is desired for a negative-working photosensitive ink, then a negative-type image-bearing transparency should be used for imagewise exposure. In the practice of the present invention, both negative-working and positive-working photosensitive inks are suitable, and both types of image-bearing transparencies may be used. The methods may therefore be used to produce both positive images and negative images.

Conventional image-bearing transparencies include a base side (or back side) and an emulsion side. In the methods of the present invention, either the base side or emulsion side may face the source of radiation. The custom-coated ink-receiving layer may face either the base side or emulsion side of the image-bearing transparency, or neither. It may be desirable to orient the custom-coated ink-receiving layer with respect to the image-bearing transparency to ensure that a right-reading image will be produced.

Imagewise exposure induces or initiates a change in the photosensitive ink in the exposed areas. In one embodiment of the present invention, the photosensitive ink comprises a photopolymerizable component. Imagewise exposing the custom-coated ink-receiving layer initiates photopolymerization of the photopolymerizable component. By way of example, MATCHPRINT PLUS INKS referred to above are negative-working photopolymerizable inks.

The determination of specific parameters for imagewise exposing the custom-coated ink-receiving layer may be made according to conventional methods. The methods of the present invention are readily adaptable to a wide variety of proofing techniques. As mentioned, the methods are suitable to make custom-color overlays or stock-color overlays using both analog and digital processes. The methods are likewise suitable for making custom-color or stock-color halftone overlays or continuous-tone overlays.

Furthermore, the methods may be adapted for "computer-to-proof" imaging, by which an image is generated without the use of an image-bearing transparency. Computer-to-proof imaging generally employs a computer-controlled rasterized laser to generate an image corresponding to a digitized image stored as a computer file.

Developing

Another step of the method includes developing the custom-coated ink-receiving layer after imagewise exposure, to produce an imaged overlay. The developing step may include washing of the custom-coated ink-receiving layer to remove at least a portion of the ink. A suitable developing solution may be used for washing the custom-coated ink-receiving layer. Other methods of physically or chemically removing portions of the ink could also be employed. In an alternative embodiment, a photobleachable, photodegradable, or photoablatable ink could be developed by the imagewise exposing step to produce the imaged overlay.

In one embodiment, the step of developing removes ink from unexposed areas while leaving ink in exposed areas. For example, if the photosensitive ink contains a photopolymerizable component, imagewise exposing the custom-coated ink-receiving layer initiates photopolymerization of the photopolymerizable component, and the the step of developing removes ink from unexposed areas while leaving ink in exposed areas.

Where the step of developing includes washing, a suitable developing solution may be used for washing the custom-coated ink-receiving layer. The appropriate developing solution will correspond to the nature of the photosensitive ink that is used, as will be appreciated by those skilled in the art. Washing of the custom-coated ink-receiving layer may be assisted by mechanical scrubbing, such as may be provided by brushes. An automated apparatus suitable for developing a custom-coated ink-receiving layer is the Model 2430 processor from Kodak Polychrome Graphics.

In an embodiment of the method, an aqueous-based developing solution may be used. A suitable aqueous-based developing solution includes components such as a surfactant and an anti-foaming agent.

By way of example, when a photosensitive ink consisting of either stock or blended MATCHPRINT PLUS INKS is coated onto a MATCHPRINT PLUS RECEIVER SHEET, a suitable developing solution may be made by diluting MATCHPRINT PLUS DEVELOPER CONCENTRATE according to the manufacturer's directions. MATCHPRINT PLUS DEVELOPER CONCENTRATE is available commercially from Kodak Polychrome Graphics. The developer concentrate is an aqueous solution comprising disodium decyl(sulfophenoxy)benzenesulfonate, a (poly)oxyalkylene polymer, and a siloxane glycol copolymer.

Overlay Proof Including a Custom-Color Overlay

In another embodiment, the invention provides a method for making an overlay proof including an imaged custom-color overlay. The method includes the steps of making an imaged custom-color overlay according to a method described herein, and assembling in registration the imaged custom-color overlay with at least one other proof component to produce the overlay proof.

In one embodiment, the imaged custom-color overlay can be made with equipment and materials that are ordinarily used for making surprint proofs. An advantage of the methods of the invention, therefore, is that an end user is provided the flexibility of making either surprint proofs or overlay proofs with the same equipment and the same set of consumable materials.

Custom-Color Overlay

A custom-color overlay is made by a) providing a photosensitive water-soluble ink of a selected custom color; b) providing a carrier sheet comprising a transparent support sheet and an ink-receiving layer; c) custom-coating the ink-receiving layer with a substantially uniform layer of the ink; d) drying the ink to produce a custom-coated ink-receiving layer; e) imagewise exposing the custom-coated ink-receiving layer, to produce an exposed custom-coated layer; and f) developing the exposed custom-coated layer, to provide the imaged custom-color overlay. Steps a) through f) may be performed according to any of the variations described above for producing an imaged custom-color overlay.

Assembly of Proof Components

In an additional step, the imaged custom-color overlay is assembled in registration with at least one other proof component to produce an overlay proof. As used herein, the phrase "proof component" means any image-bearing or non-image-bearing element, typically in sheet form, that could be assembled to make an overlay proof. Proof components made by either analog or digital processes are suitable. Examples of proof components that may be assembled to make the overlay proof of the invention are numerous, and include an imaged overlay, a base sheet, a non-imaged cover sheet, a laminated or other surprint proof, etc.

Assembling in registration includes fitting the imaged custom-color overlay and the other proof component(s) in alignment, so that the image on the custom-color overlay properly corresponds to an image or other feature of the other proof component. Assembling in registration is often done by aligning crosshairs (or some other feature that is provided for that purpose) between the respective proof components.

Assembling of the proof components also includes steps of mounting or fixing the proof components (including the imaged custom-color overlay) to one another or to a base material or separate cover sheet. Mounting or fixing the proof components may be achieved by conventional methods such as, for example, binding or taping together the proof components.

By way of example, the other proof component may be an imaged overlay for a process color or spot color prepared according to the method described above. The other proof component may also be a second imaged custom-color overlay in a second custom color, prepared according to the method described above.

An imaged overlay made from a precolored overlay film would also be suitable as the other proof component. By way of example, an imaged overlay made by the COLOR KEY proofing system would be suitable.

In one embodiment, the proof components include at least one imaged custom-color overlay with imaged overlays for four process colors. In this manner, the imaged custom-color overlay can be a fifth or sixth color addition to a standard four-color overlay proof such as a COLOR KEY proof. This embodiment is especially suitable where a five- or six-color printing process is to be employed.

Alternatively, the other proof component may be a laminated proof or surprint proof. Processes for making laminated proofs or surprint proofs are well-known. For example, a laminated proof made by the MATCHPRINT process would be suitable. Where the other proof component is a laminated proof, the imaged custom-color overlay would be placed over the imaged surface of the laminated proof.

EXAMPLE

Making a Custom-Color Overlay Proof

A four-color overlay proof was constructed, comprising four custom-color overlays. Each overlay included an image in a single custom color. The process to produce the four-color overlay proof included the following steps.

Four PANTONE colors were selected to match a multi-colored corporate trademark. The selected custom colors were Yellow 135, Cream 1205, Silver 877 and Blue 2955. A particular photosensitive custom-color ink was then mixed for each selected custom color, according to formulations as listed in the "MATCHPRINT PLUS Mixing Guide For PANTONE Colors."

The first custom color mixed was PANTONE Yellow 135. A clean empty mixing bottle was labeled with the PANTONE number and the formulation. Yellow 135 requires 83.3 grams of MATCHPRINT PLUS Transparent White ink, 12.3 grams of MATCHPRINT PLUS Yellow ink, and 4.4 grams of MATCHPRINT PLUS Warm Red ink.

The individual inks of the formulation were thoroughly mixed before the quantity required by the formulation was measured. The empty bottle was placed on a digital scale and the tare weight was recorded. The required quantity of each ink was then dispensed into the bottle. A lid including a nozzle tip was then placed on the bottle and the ink mixture was shaken vigorously. The freshly mixed Yellow 135 custom-color ink was allowed to settle for approximately 5 to 10 minutes so that bubbles could dissipate.

Custom-color inks for Cream 1205, Silver 877 and Blue 2955 were similarly prepared.

Next, an imaged custom-color overlay was prepared by the following steps. A carrier sheet (MATCHPRINT PLUS RECEIVER SHEET) was obtained, and the protective slip sheet was removed from the side to be coated. The carrier sheet was then positioned, with an ink-receiving emulsion layer facing up, on the bed of an automated coater, MODEL 3040 MATCHPRINT PLUS COATER, and secured by holding brackets. A clean #11 Meyer bar was mounted in the coater.

Yellow 135 custom-color ink was then coated onto the ink-receiving layer (i.e., the emulsion layer) of the carrier sheet, as follows. The nozzle tip of the bottle was opened and the bottle inverted. The nozzle tip was carefully placed at the nip formed where the Meyer Bar met the receiver sheet, at the distal end of the Meyer Bar. A bead of ink, approximately ½" in diameter, was formed on the receiver sheet along the entire length of the Meyer bar, following the nip. The automated coater was then actuated, causing the Meyer bar to be pulled across the surface of the carrier sheet. A thin and substantially uniform layer of wet ink on the carrier sheet resulted.

The automated coater then dried the ink to produce a custom-coated ink-receiving layer. Warm air was blown by a fan in a coater/dryer head as the head was moved above the layer of wet ink, drying the ink.

The custom-coated ink-receiving layer was then imagewise exposed. The carrier sheet was positioned in an UV vacuum frame. A negative image-bearing color-separation film corresponding to the custom-color ink was positioned over the custom-coated ink-receiving layer. The vacuum frame was activated to hold the carrier sheet and film in position. An ultraviolet source fitted with a Kokomo filter was used to expose to a solid 5.0, scum 6.0, on a 10-step grayscale.

After imagewise exposure, the exposed custom-coated layer was developed as follows. The exposed custom-coated layer was processed through a Model 2430 processor from Kodak Polychrome Graphics, utilizing a developing solution prepared from MATCHPRINT PLUS DEVELOPER CONCENTRATE according to the manufacturer's directions. An imaged custom-color overlay resulted.

After processing, the imaged custom-color overlay was cropped to the desired proof size. The imaged custom-color overlay was then placed, right-reading, on top of a substrate and taped in place.

An imaged custom-color overlay for Cream 1205, Silver 877 and Blue 2955 was made for each color, following the same steps. The four custom-color overlays were assembled in registration and bound to yield a four-color overlay proof. The final overlay proof simulated the four selected PANTONE colors more accurately than would have been possible using precoated, stock-color overlay films available from a manufacturer. The final overlay proof also matched the colors of the corporate trademark more accurately than would have otherwise been possible.

In describing preferred embodiments of the invention, specific terminology is used for the sake of clarity. The invention, however, is not intended to be limited to the specific terms so selected, and it is to be understood that each term so selected includes all technical equivalents that operate in an equivalent manner. This invention may take on various modifications and alterations without departing from the spirit and scope thereof Accordingly, it is to be understood that this invention is not to be limited to the above-described embodiments, but it is to be defined by the limitations set forth in the following claims and any equivalents thereof

What is claimed is:

1. A method for producing an imaged custom-color overlay, comprising:
   a) blending at least two stock inks to provide a photosensitive water-soluble ink of a selected custom color;
   b) providing a carrier sheet comprising a transparent support sheet and an ink-receiving layer;
   c) custom-coating the ink-receiving layer of the carrier sheet with a substantially uniform layer of the ink;
   d) drying the ink to produce a custom-coated ink-receiving layer on the transparent support sheet;
   e) imagewise exposing the custom-coated ink-receiving layer, to produce an exposed custom-coated layer; and
   f) developing the exposed custom-coated layer, to provide an imaged custom-color overlay comprising the transparent support sheet and a developed custom-coated layer.

2. The method of claim 1 wherein the photosensitive ink comprises a photopolymerizable component.

3. The method of claim 2 wherein imagewise exposing the custom-coated ink-receiving layer initiates photopolymerization of the photopolymerizable component, and wherein developing the exposed custom-coated layer removes ink from unexposed areas while leaving ink in exposed areas.

4. The method of claim 1 wherein the selected custom color is matched to a predetermined color.

5. The method of claim 1 wherein the carrier sheet comprises an ink-receiving emulsion layer.

6. The method of claim 1 wherein custom-coating the ink-receiving layer is performed using a Meyer bar.

7. The method of claim 1 wherein the step of imagewise exposing includes exposing the custom-coated ink-receiving layer to ultraviolet illumination.

8. The method of claim 1 wherein the step of imagewise exposing includes exposing the custom-coated ink-receiving layer to radiation from a laser.

9. The method of claim 1 wherein the step of imagewise exposing includes generating an image corresponding to a computer-stored digital image file.

10. A custom-color overlay formed by the method of claim 1.

11. A method for producing an overlay proof, comprising:
    a) blending at least two stock inks to provide a photosensitive water-soluble ink of a selected custom color;
    b) providing a carrier sheet comprising a transparent support sheet and an ink-receiving layer;
    c) custom-coating the ink-receiving layer of the carrier sheet with a substantially uniform layer of the ink;
    d) drying the ink to produce a custom-coated ink-receiving layer on the transparent support sheet;
    e) imagewise exposing the custom-coated ink-receiving layer, to produce an exposed custom-coated layer;
    f) developing the exposed custom-coated layer, to produce an imaged custom-color overlay comprising the transparent support sheet and developed custom-coated layer; and
    g) assembling in registration the imaged custom-color overlay with at least one other proof component to produce the overlay proof.

12. The method of claim 11 wherein the step of assembling includes assembling the imaged custom-color overlay with at least one imaged precolored overlay to produce a multi-layered overlay proof.

13. The method of claim 12 wherein the precolored overlay is one of cyan, magenta, yellow, or black.

14. The method of claim 11 wherein steps (a) through (f) are repeated to provide a second imaged custom-color overlay, and wherein the overlay proof includes the second imaged custom-colored overlay.

15. An overlay proof formed by the method of claim 11.

16. A method for producing an imaged overlay, comprising:
    a) blending at least two stock inks to provide a photosensitive ink of a selected color;
    b) providing a carrier sheet comprising a transparent support sheet and an ink-receiving layer;
    c) custom-coating the ink-receiving layer of the carrier sheet with a substantially uniform layer of the ink;
    d) drying the ink to produce a custom-coated ink-receiving layer on the transparent support sheet;
    e) imagewise exposing the custom-coated ink-receiving layer, to produce an exposed custom-coated layer; and
    f) developing the exposed custom-coated layer, to provide an imaged overlay comprising the transparent support sheet and a developed custom-coated layer.

17. The method of claim 16 wherein the photosensitive ink is water-soluble.

18. The method of claim 16 wherein the photosensitive ink is aqueous-based.

19. The method of claim 16 wherein the selected color is a custom color.

* * * * *